United States Patent [19]

Kwok

[11] Patent Number: 5,265,038
[45] Date of Patent: Nov. 23, 1993

[54] COMPUTER SYSTEM PERIPHERAL CONNECTION PULSE FILTERING TECHNIQUE AND CIRCUIT

[75] Inventor: Pak-On Kwok, San Jose, Calif.

[73] Assignee: Zilog, Inc., Campbell, Calif.

[21] Appl. No.: 679,739

[22] Filed: Apr. 3, 1991

[51] Int. Cl.[5] .............................................. H03K 5/00
[52] U.S. Cl. .................................. 364/572; 364/574; 307/520
[58] Field of Search ...................... 364/569, 572, 574; 307/520; 328/111, 167

[56] References Cited

U.S. PATENT DOCUMENTS

| | | | |
|---|---|---|---|
| 4,353,032 | 10/1982 | Taylor | 307/520 |
| 4,760,279 | 7/1988 | Saito et al. | 307/520 |
| 5,001,374 | 3/1991 | Chang | 307/520 |
| 5,113,098 | 5/1992 | Teymouri | 307/520 |

OTHER PUBLICATIONS

"Z85C80 CMOS SCSCI Serial Communication and Small Computer Interface", Preliminary Product Specification, Zilog, Inc., 1990.

*Primary Examiner*—Thomas G. Black
*Assistant Examiner*—Michael Zanelli
*Attorney, Agent, or Firm*—Majestic, Parsons, Siebert & Hsue

[57] ABSTRACT

A filtering circuit and technique that is especially adapted to remedy the possibility of pulses from becoming corrupted when passing between a microcomputer unit and one or more peripheral devices, as they are communicated over an interconnecting cable, to the point of causing errors to occur in operation of the computer system. The specific circuit disclosed is especially adapted to operate with a small computer system interface ("SCSI") interconnecting bus standard. Adverse effects of false pulses created by voltage supply variations on the interconnecting cable and reflections of pulses along the cable due to impedance mismatches are remedied.

14 Claims, 4 Drawing Sheets

| FIG. 2A. | FIG. 2B. |

COMPUTER SYSTEM PERIPHERAL CONNECTION PULSE FILTERING TECHNIQUE AND CIRCUIT

BACKGROUND OF THE INVENTION

This invention relates to techniques for providing uncorrupted communication between units of computer system that are interconnected by a cable.

Microcomputer systems, as it known to practically everyone, utilize a central computer or processing unit that is interconnected with a one or more other separate units by an appropriate electrical cable. Such other units can include various peripherals, such as printers, disk storage drives, and the like. It is, of course, important that various control, status, and data pulses are transmitted between the peripheral devices and the central computing unit, any corruption of the transmitted pulses being maintained at a level low enough so as not to affect operation of the computer system.

One such computer system is the Apple Macintosh brand. Its central computing unit includes a monitor, one or more disk drives, and several plugs (ports) for connection by cable with one or more separate peripheral units, such as a printer. One such port provided for this purpose follows an industry standard Small Computer System Interface, generally referred to as a "SCSI" standard. This standard designates the various conductors and plug pins of an 18-conductor cable for carrying various types of signals, the signal voltage levels, and similar parameters. The individual conductors are biased at a positive voltage, pulses being communicated along them by driving the voltage down. The central computing unit knows a pulse exists in a line by detecting its trailing, rising voltage edge. Eight conductors of the SCSI bus are designated as a data bus, another as a request line, yet another as an acknowledge line, with the remaining conductors providing various other control and status functions.

In operation of some Macintosh brand computer systems, it has been found that acknowledge signals are sent by the central computing unit over the acknowledge line of the interconnecting cable to a peripheral in response to something on the request line other than a proper request pulse generated by a peripheral. This can result in the central computing unit taking in false data from the data bus lines, or sending out such false data.

It is therefore a primary object of the present invention to provide a technique, and circuit implementation thereof, for minimizing or eliminating false requests from being acted upon by the central computing unit.

SUMMARY OF THE INVENTION

This and additional objects are accomplished by the present invention, wherein, briefly and generally, two causes of such false triggering have been identified and remedied by a pulse filtering circuit added to a SCSI bus interface circuit in the central computing unit in at least the request line. Although the pulse filtering circuit and technique of the present invention are especially adapted to eliminate the false requests detected by the central computing unit, as described above, such a circuit and technique can be used with any or all lines of the SCSI or other type of bus, at a central computing unit or peripheral device, in various brands and with various communication standards, where pulses are being received.

A first cause of the false request signals being detected is an instantaneous change of bias voltage of the bus line that is interpreted as a pulse. Such a voltage drop is believed due to fluctuations in power supply voltage, such as those caused by a number of other bus lines being connected to the power supply at the same time. Since these false pulses have a duration significantly shorter than the duration of pulses desired to be detected, they are filtered out by a circuit that responds only to pulses exceeding a predetermined duration.

A second cause of request pulses being falsely detected is reflections that can occur along the interconnecting cable at points of impedance mismatch or discontinuity. If, for example, a branch of the interconnecting cable is left unconnected or is connected with a peripheral device having an input impedance significantly different from that of the cable, a pulse will be reflected along the cable. The result is either a corruption of the pulse's trailing edge or the generation of additional short pulses following the pulse of interest, or both. The pulse filtering circuit and technique of the present invention reshapes the critical trailing edge of the pulse to assure that only a single, clean trailing edge reaches the part of the central computing unit that operates in response to pulse trailing edges. This is accomplished by creating a delayed version of an incoming signal as the output but terminating and suppressing the delayed output by a pulse initiated by the first trailing edge detected in the undelayed signal. This results in an output pulse with a single clean trailing edge. Other false edges resulting from pulse echoes and the like are suppressed for the duration of the internally generated pulse.

Additional objects, advantages and features of the present invention will become apparent from the following detailed description of a preferred embodiment thereof, which description should be taken in conjunction with the accompanying drawings.

DESCRIPTION OF A PREFERRED EMBODIMENT

Figure 1:
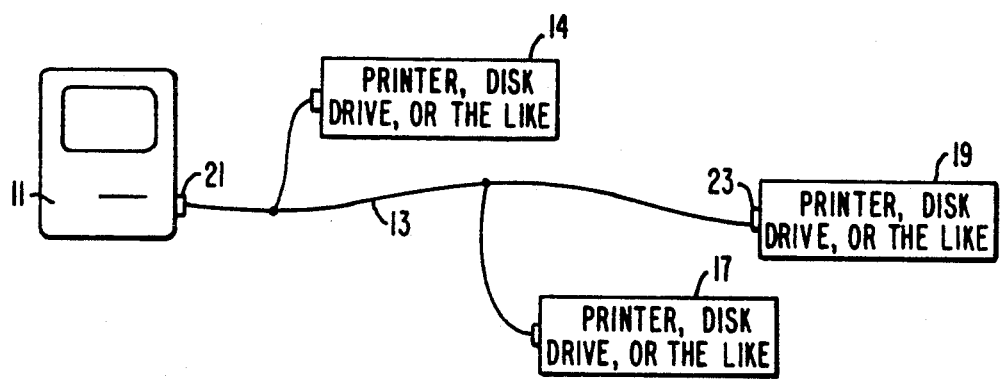
FIG. 1 illustrates very generally a computer system in which the present invention is utilized.

Referring initially to FIG. 1, a central computing unit 11 is shown connected through a cable 13 to various peripheral units 15, 17 and 19. These peripheral units can include, for example, printers, disk drives, and the like. The cable 13 is terminated at one end in a plug 21 that is accepted by a SCSI port of the central computing unit 11. Similarly, a plug 23 is provided at an opposite end of the cable 13 for interconnecting with the peripheral unit 19. Various branches of the cable 13, such as shown going to additional peripherals 14 and 17, may be used as well. An example of the computer system illustrated in FIG. 1 is that sold under the Apple Macintosh brand.

Figure 2A:
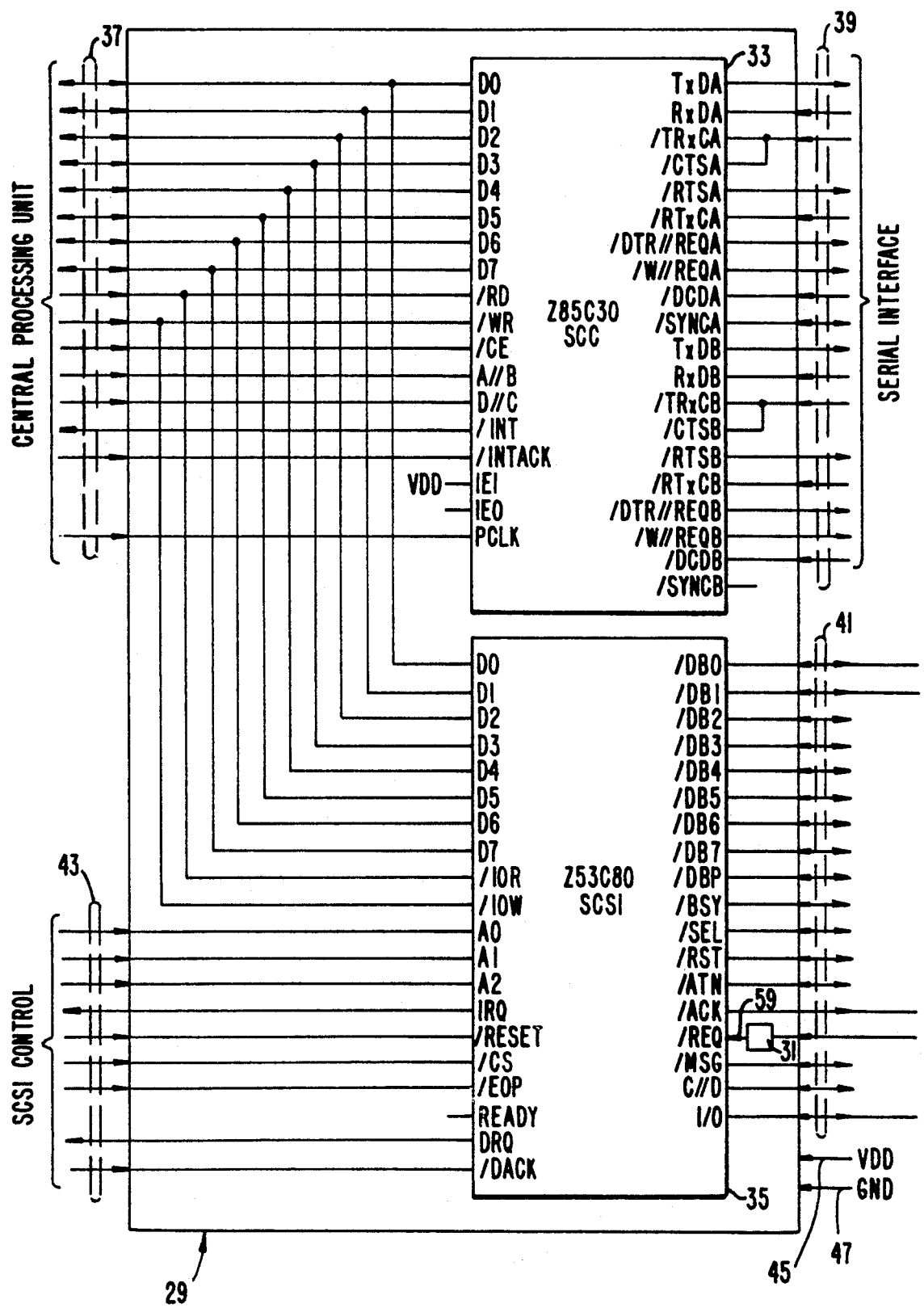
FIG. 2, comprising FIGS. 2A and 2B arranged as shown, shows a SCSI bus interconnecting the various units of the computer system of FIG. 1.
Figures 2, 2B:
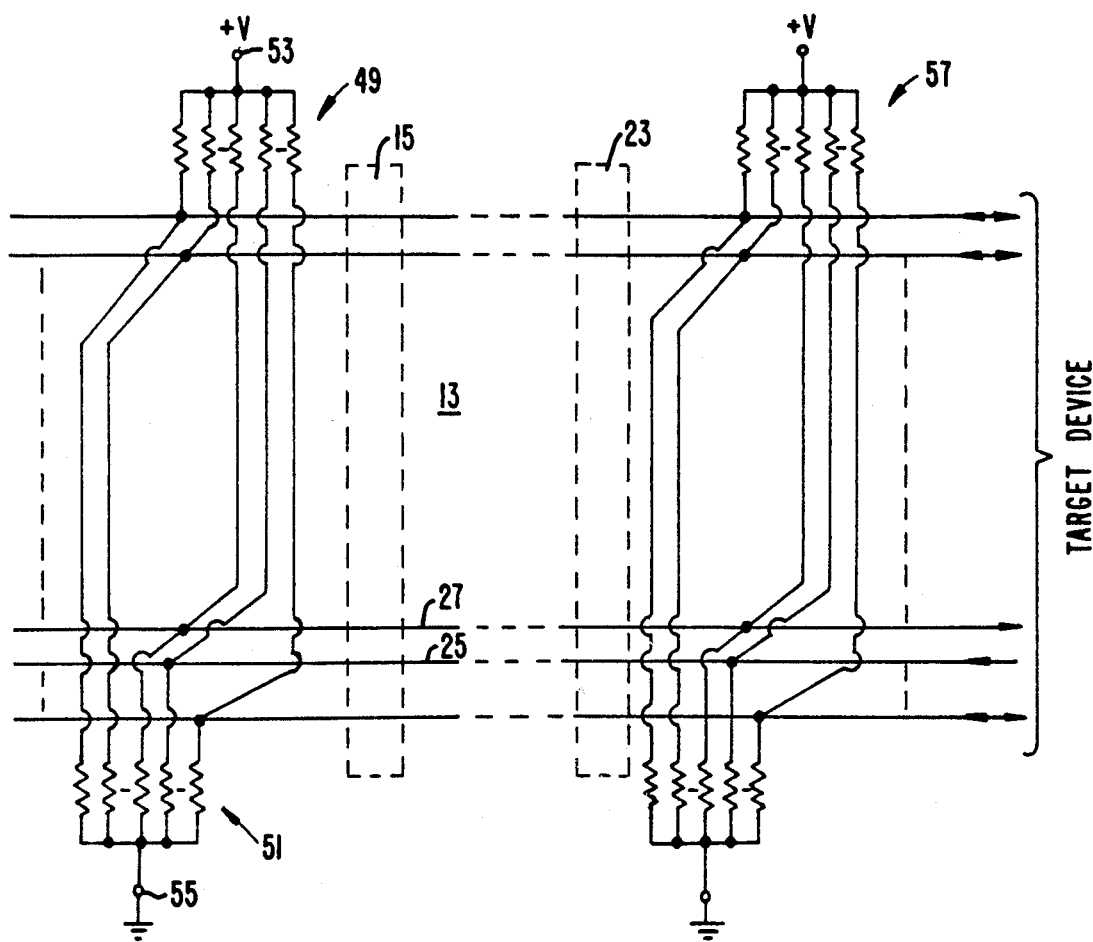

Referring to FIG. 2, the SCSI bus and interface with the central computing unit 11 and peripheral 19 of FIG.

1 is shown in some detail. The cable 13 includes, under the SCSI standard, eighteen separate conductors, eight of which are used for data transmission. Another of these conductors 25 is designated as a request line over which a peripheral sends a pulse to the central computing unit 11 when it wants to gain access for communications over the data lines of the cable 13. Another line 27 carries an acknowledgement pulse from the central processing unit 11 to the peripheral in response to receiving the request pulse. After the acknowledge pulse is issued, the central computing unit and the requesting peripheral are then interconnected for communicating with each other over the data lines.

A commercially available integrated circuit chip is commonly utilized for interfacing the central computing unit with the SCSI port provided at the plug 15. A circuit chip 29 of FIG. 2 is of a type commercially available, except that a pulse filtering circuit 31 has been added as part of the integrated circuit chip 29 in the path of the request line 25. Otherwise, the circuit chip 29, without the improved pulse filter 31, is available from Zilog, Inc., assignee of the present invention, under Part No. Z85C80. This part is described in a Preliminary Product Specification entitled "Z85C80 CMOS SCSCI Serial Communication and Small Computer Interface", dated 1990 and available from Zilog, Inc., which is incorporated herein by this reference.

This commercially available circuit chip includes two functions previously implemented on separate integrated circuit chips. One function is performed by a serial communications controller 33 and the other by a SCSI bus interface 35. Both of these portions of the current version of the single integrated circuit 29 are connected to a group of pins or terminals 37 that connect with a system bus of the central computing unit 11. Another set of pins or terminals 39 provide a serial interface from the circuit portion 33. Yet another group of pins or terminals 41 provides the SCSI bus interface of the central computing unit 11 at its plug 15. Finally, another group of pins or terminals 43 provides for a connection with various SCSI bus control lines within the central computing unit 11. Also, of course, pins or terminals 45 and 47 are provided for connection to a power supply.

As mentioned previously, the SCSI bus standard provides for maintaining each of its eighteen circuit conductors at a voltage elevated above ground when in an inactive mode. A pulse is then generated in a line by reducing its voltage for the duration of the pulse. Such steady state voltage supply and voltage dividers for the lines are shown in FIG. 2, in the form of groups 49 and 51 of resistors connected as voltage dividers between a +V terminal 53 and a ground terminal 55. A similar voltage biasing circuit 57 is provided at the other end of the cable.

The circuit portion 31 added as part of the integrated circuit chip 29 of FIG. 2 receives as an input the request line 25 from outside the central computing unit 11, and provides as an output in a line 59 the request signal to the SCSI circuit portion 35. The purpose of the circuit addition 31 is to filter out or suppress any pulse rising edges that are caused by fluctuations in the +V voltage power supply used to bias the SCSI bus, and/or those caused by pulse reflections at impedance discontinuities in the connection of various peripheral units to the circuit chip 29. An example of a circuit that eliminates unwanted pulses from both causes is shown in FIG. 3.

Figure 3:
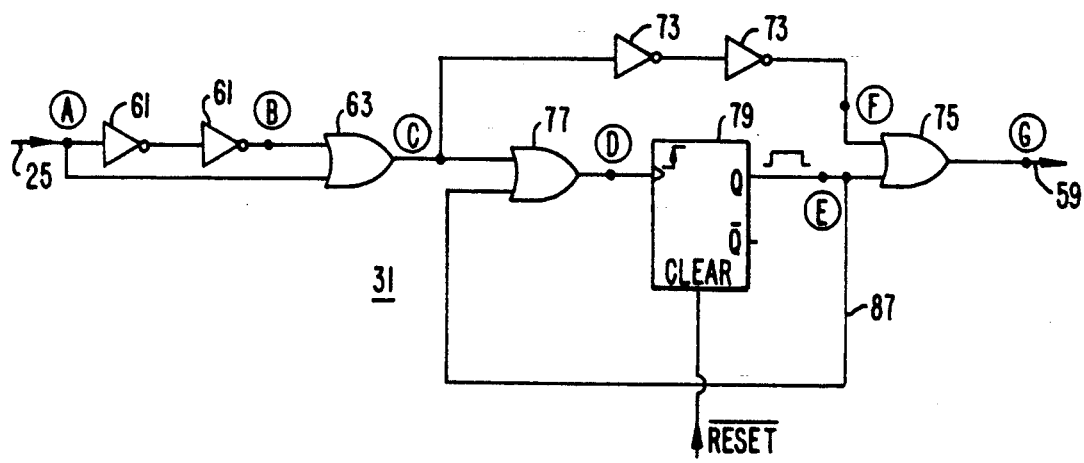
FIG. 3 is a circuit diagram of a portion of the SCSI bus interface shown in FIG. 2; and, FIG. 4, comprising waveforms 4(A)–4(G), show various voltage waveforms that illustrate the operation of the circuit of FIG. 3.

With reference to FIG. 3, the circuit is explained by describing its two parts separately. A first part extends from an input node A in input line 25 and through a fixed time delay circuit 61 interconnected at a node B as one input to an OR-gate 63. An output of this first circuit portion is provided at a node C. The delay circuit 61 can be of any known type, indicated in FIG. 3 to be a series connection of two inverters. A second input to the OR-gate 63 is connected directly with the input line 25 node A.

Figure 4:
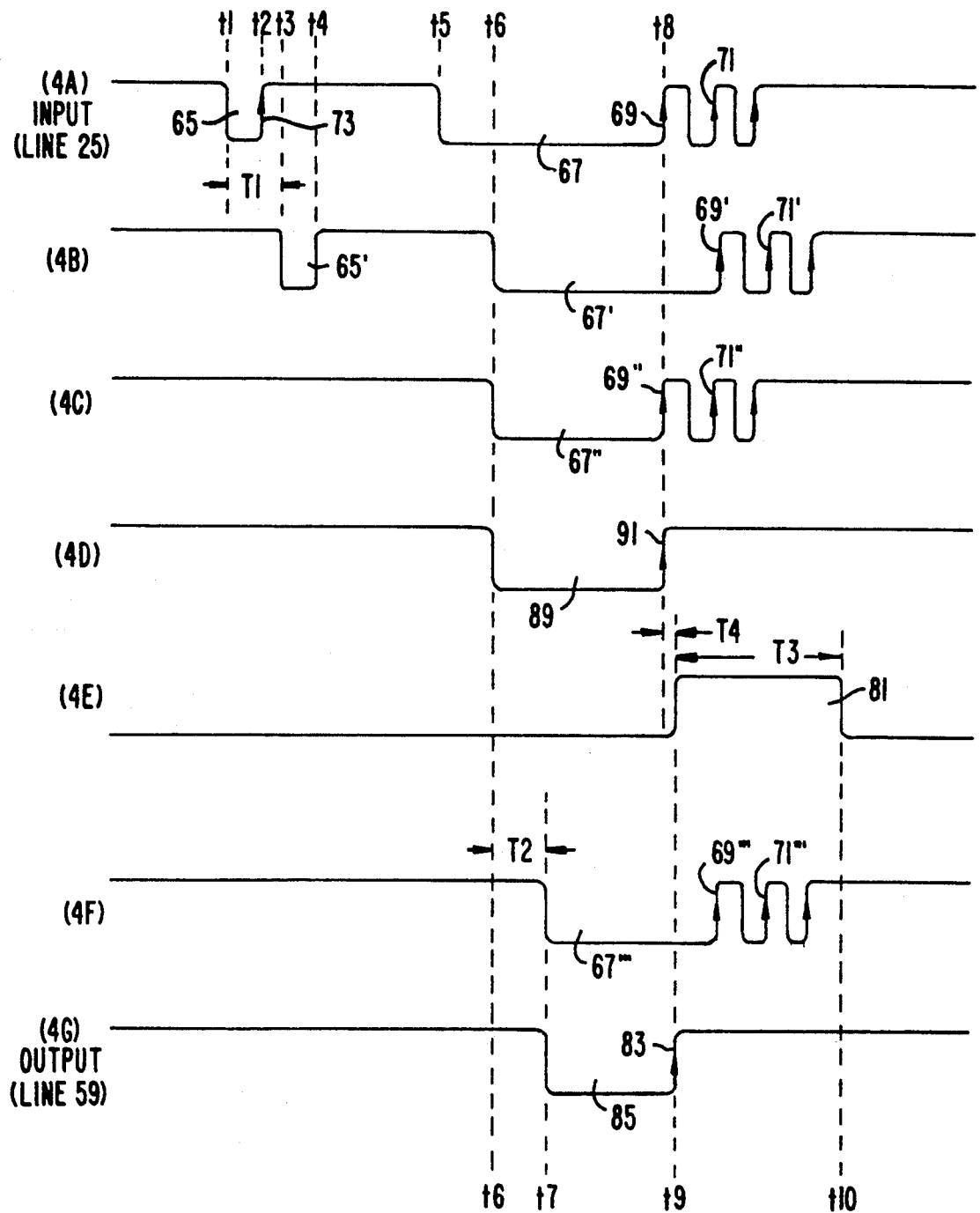

Operation of this first portion of the circuit can be understood from waveforms 4(A) through 4(C), shown in FIG. 4, which provide example waveforms at nodes A through C, respectively, of FIG. 3. Waveform 4(A) is a corrupted signal of a type that can be received at node A during operation of the system of FIG. 1. The example chosen for illustration includes a short pulse 65 occurring between times t1 and t2 as the result of a momentary dip in the supply voltage +V or some similar cause. Also shown in this example input waveform is a pulse 67 that is close to what has been transmitted from a peripheral unit, including a trailing, rising edge 69 which is desired to be acted upon by the central computing unit 11. However, the rising edge 69 may not be as clean as indicated in FIG. 4, and is followed by one or more shorter pulses, such as one having a rising edge 71, due to echoes in the transmission line at impedance discontinuities. It is desired that these additional rising edges be suppressed by the circuit 31.

The circuit's first portion being described, between nodes A and C, however, does not affect the undesired rising pulse edge 71. Rather, it eliminates the pulse 65 and its rising edge 73 that can trigger some undesired action in the central computer unit. This pulse elimination is accomplished by choosing the delay of the circuit 61, indicated at T1 on FIG. 4, that is greater than the duration of the undesired pulses to be suppressed. Both the pulse 65 and delayed pulse 65' at node B are applied to the OR-gate 63 at different times, resulting in its output at node C being as shown in waveform 4(C), without the undesired pulse 65. This results since the output of the OR-gate 63 will drop in voltage only if both inputs drop in voltage. This does not occur until time t6 when the longer duration pulse 67 and its delayed counterpart 67' are applied at the same time as inputs to the OR-gate 63.

A second portion of the circuit, between nodes C and G, is adapted to eliminate rising 71 and similar ones from the input signal of waveform 4(A), as well as making sure that the rising edge 69 of the desired pulse is crisp and detectable with certainty by the central computing unit 11. Two main signal paths are provided in this portion. One such signal path is a second delay circuit 73 connected between the node C and having an output connected to a node F that is, in turn, connected as one input to an OR-gate 75. A second signal path from node C includes an OR-gate 77, having one input connected to node C, and an output at a node D connected as a clock input to a non-retriggerable one-shot multivibrator circuit 79. An output of the one-shot 79, at node E, is connected as a second input to the OR-gate 75. An output of the OR-gate 75, indicated as node G, is line 59 to the SCSI circuit portion 35 (FIG. 2). Waveforms 4(D) through 4(G) provide example waveforms at nodes D through G, respectively, of the circuit of FIG. 3.

Referring to waveform 4(F), the signal at node F is the same as that at node C, as indicated in waveform 4(C), except that it is delayed by a time t2 caused by the delay circuit 73. This delayed signal is passed through the OR-gate 75 to the output node G so long as the signal at node E is low; that is, in the absence of a pulse being emitted by the one-shot 79. But it is desired to use this output pulse to effectively disconnect the signal at node F from node G during the period of instability including the undesired subsequent pulse rising edge 71''' of waveform 4(F). This is accomplished by triggering the one-shot 79 at a time t8 in response to the rising edge 69'' of the pulse 67'' from Node C through the OR-gate 77. The delay T2 of the signal at node F is made to be significantly less than the duration of the pulse 6'' at node C. This then results in a pulse 81 of waveform 4(E) having a duration T3 commencing at time t9, a short time T4 after the rising edge 69'' of the pulse in waveform 4(C) occurs at time t8. The time T4 is due to an inherent delay in the one-shot 79. Once the output of node E goes high, for the duration of pulse 81, the OR-gate 75 effectively cuts off the delayed signal from node F so that node G goes high again, as indicated at time t9 in waveform 4(G).

It can be seen from FIG. 4 that, if the duration T3 of the pulse 81 is sufficient to include all the undesired transient activity in the signal at node F, none of it passes to the output node G. Further, a clean rising edge 83 of an output pulse 85 exists at node G since the leading edge of the pulse 81 at node E is timed to occur significantly in advance of the questionable edge 69''' of the delayed signal in node F.

Thus, it can be seen that the second portion of the circuit of FIG. 3 eliminates the edges resulting from pulse echo within the transmission cable 13 by triggering the one-shot 79 from an undelayed signal at node C and using the resulting pulse at node E to suppress or disable the delayed signal at node F before the undesired edges occur. The delay time T2 of the delay circuit 73 is made to be greater than the one-shot 79 triggering delay T4, but less than its output pulse duration T3.

As extra insurance against the one-shot 79 being retriggered by the edge 71 and the like of the undesired echo pulses, the node E is connected through a line 87 as a second input to the OR-gate 77. The resultant signal at the output of the OR-gate 77, at node D as shown in waveform 4(D), is a clean pulse 89 having a rising edge 91 that triggers the one-shot 79 and cuts off any subsequent edges from being applied to the one-shot 79 until the termination of its output pulse 81.

Although the present invention has been described with respect to a preferred implementing embodiment thereof, it will be understood that the invention is entitled to protection within the full scope of the appended claims.

What is claimed is:

1. In a computer system having a microcomputer unit with a port operating in accordance with a SCSI standard connected to one or more peripheral devices over a length of multi-conductor cable, one conductor of which is a request line from the peripherals to the microcomputer unit and another is an acknowledge line from the microcomputer unit to the peripherals, a pulse filtering circuit provided as part of the microcomputer unit and connected in at least the request line, comprising:

means connected to the request line for preventing pulses of less than a first fixed duration thereon from reaching a first circuit node while allowing pulses of greater than said first fixed duration on the request line to reach said first circuit node, thereby to suppress unintended pulses less than said first fixed duration that might appear in the request line, means connected to said first circuit node for delaying by a second fixed duration propagation of the pulses greater than said first fixed duration from the first circuit node to a second node, means responsive to a trailing edge of pulses at the first circuit node for generating a pulse at a third circuit node having a third fixed duration, and means connected to said second and third circuit nodes for passing an initial segment of the delayed pulses at the second circuit node to the microcomputer while suppressing ending segments of said delayed pulses during the third fixed duration of the pulses at the third circuit node, thereby to shield the microcomputer from undesirable effects that can occur at trailing edges of the delayed pulses as a result of reflections of pulses on the request line.

2. The combination according to claim 1 wherein said pulse preventing means includes an OR-gate having as inputs said request line and an output of a first delay circuit that in turn has an input connected with said request line, whereby signals at said request line occur at the output of said first delay circuit with said first fixed duration in delay, an output of said OR-gate being connected to said first circuit node.

3. The combination according to claim 1 wherein said pulse generating means includes a one-shot multivibrator that is triggerable at an input by trailing edges of pulses at the first circuit node.

4. The combination according to claim 3 which additionally comprises an OR-gate having an output connected to the one-shot multivibrator input and two inputs, one of said OR-gate inputs being connected to the first circuit node and another of said OR-gate inputs being connected to said third circuit node.

5. The combination according to claim 1 wherein said pulse segment passing means includes an OR-gate having separate inputs connected to said second and third circuit nodes and an output providing signals to said microcomputer.

6. The combination according to claim 1 wherein said third fixed duration is less than said second fixed duration.

7. A single integrated circuit chip adapted for use in a computer system, comprising:

a first set of terminals adapted for connection with a data bus of the computer system, a serial communication controller circuit connected between said first set of terminals and a second set of terminals adapted for connection with a communication device, a small computer system interface circuit connected between said first set of terminals and a third set of terminals adapted for connection with a peripheral device, said interface circuit adapted to respond to trailing edges of pulses received from a peripheral device on at least one of said third set of terminals, and a pulse filtering circuit connected between at least one terminal of said third set of terminals and said interface circuit, said pulse filtering circuit including means receiving a signal pulse from said at least one terminal for delaying said pulse by a set time, and additional means also receiving said signal pulse and responsive to a trailing edge thereof for cleanly terminating the delayed signal pulse substantially thereat, whereby any reflection or other noise in the signal pulse at about trailing edge is suppressed before being applied to said interface circuit.

8. The circuit chip according to claim 7 wherein said pulse filtering circuit additionally includes means responsive to pulses received at said at least one terminal for preventing pulses of a duration less than said signal pulse from reaching said filtering means, thereby to suppress unintended received pulses.

9. A single integrated circuit chip adapted for use in a computer system, comprising:
   a first set of terminals adapted for connection with a data bus of the computer system,
   a serial communication controller circuit connected between said first set of terminals and a second set of terminals adapted for connection with a communication device,
   a small computer system interface circuit connected between said first set of terminals and a third set of terminals adapted for connection with a peripheral device, said interface circuit adapted to respond to trailing edges of pulses received from a peripheral device on at least one terminal of said third set of terminals, and
   a pulse filtering circuit connected between said at least one terminal and said interface circuit, said pulse filtering circuit including:
      means connected to said at least one terminal for preventing pulses of less than a first fixed duration thereon from reaching a first circuit node while allowing pulses of greater than said first fixed duration at said at least one terminal to reach said first circuit node, thereby to suppress unintended pulses less than said first fixed duration that might appear at said at least one terminal,
      means connected to said second circuit node for delaying by a second fixed duration propagation of the pulses greater than said first fixed duration from the second circuit node to a third node,
      means responsive to a trailing edge of pulses at the first circuit node for generating pulses at a third circuit node having a third fixed duration, and
      means connected to said second and third circuit nodes for passing an initial segment of the delayed pulses at the second circuit node to said interface circuit while suppressing ending segments of said delayed pulses during the third fixed duration of the pulses at the third circuit node, thereby to suppress undesirable effects as might exist about trailing edges of the delayed pulses.

10. The circuit chip according to claim 9 wherein said third fixed duration is less than said second fixed duration.

11. The circuit chip according to claim 9 wherein said pulse preventing means includes an OR-gate having as inputs said at least one terminal and an output of a first delay circuit having an input connected with said at least one terminal, whereby signals at said at least one terminal occur at the output of said first delay circuit with said first fixed duration in delay, an output of said OR-gate being connected to said first circuit node.

12. The circuit chip according to claim 9 wherein said pulse generating means includes a one-shot multivibrator that is triggerable at an input by trailing edges of pulses at the first circuit node.

13. The circuit chip according to claim 12 which additionally comprises an OR-gate having an output connected to the one-shot multivibrator input and two inputs, one of said OR-gate inputs being connected to the first circuit node and another of said OR-gate inputs being connected to said third circuit node.

14. The circuit chip according to claim 9 wherein said pulse segment passing means includes an OR-gate having separate inputs connected to said second and third circuit nodes and an output providing signals to said interface circuit.

* * * * *